United States Patent
Liu et al.

(10) Patent No.: US 11,735,543 B2
(45) Date of Patent: Aug. 22, 2023

(54) DRAM MEMORY DEVICE WITH XTACKING ARCHITECTURE

(71) Applicant: Yangtze Memory Technologies Co., Ltd., Hubei (CN)

(72) Inventors: Lei Liu, Wuhan (CN); Di Wang, Wuhan (CN); Wenxi Zhou, Wuhan (CN); Zhiliang Xia, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 33 days.

(21) Appl. No.: 17/113,557

(22) Filed: Dec. 7, 2020

(65) Prior Publication Data

US 2021/0265295 A1 Aug. 26, 2021

Related U.S. Application Data

(63) Continuation of application No. PCT/CN2020/075922, filed on Feb. 20, 2020.

(51) Int. Cl.
*H01L 25/065* (2023.01)
*H01L 23/00* (2006.01)
(Continued)

(52) U.S. Cl.
CPC .............. *H01L 24/08* (2013.01); *H01L 24/80* (2013.01); *H01L 25/0657* (2013.01);
(Continued)

(58) Field of Classification Search
CPC ..... H01L 24/08; H01L 24/80; H01L 25/0657; H01L 2224/08145; H01L 2924/1431;
(Continued)

(56) References Cited

U.S. PATENT DOCUMENTS

2009/0090950 A1  4/2009  Forbes et al.
2009/0096062 A1  4/2009  Bang
(Continued)

FOREIGN PATENT DOCUMENTS

CN   109155301 A   1/2019
CN   109411473 A   3/2019
(Continued)

OTHER PUBLICATIONS

Combined Chinese Office Action and Search Report dated Jul. 28, 2022 in Chinese Patent Application No. 2021107344310 (with Translation of Category of Cited Documents), 11 pages
(Continued)

*Primary Examiner* — Thanh Y. Tran

(74) *Attorney, Agent, or Firm* — Oblon, McClelland, Maier & Neustadt, L.L.P.

(57) ABSTRACT

A semiconductor device is provided. The semiconductor device includes a first wafer having an array transistor formed therein, and a second wafer having a capacitor structure formed therein. The semiconductor device also includes a bonding interface formed between the first wafer and second wafer that includes a plurality of bonding structures. The bonding structures are configured to couple the array transistor to the capacitor structure to form a memory cell.

20 Claims, 16 Drawing Sheets

(51) Int. Cl.
    *H01L 25/18*    (2023.01)
    *H01L 25/00*    (2006.01)
    *H10B 12/00*    (2023.01)

(52) U.S. Cl.
    CPC .............. *H01L 25/18* (2013.01); *H01L 25/50* (2013.01); *H10B 12/0335* (2023.02); *H10B 12/30* (2023.02); *H01L 2224/08145* (2013.01); *H01L 2224/80895* (2013.01); *H01L 2224/80896* (2013.01); *H01L 2924/1436* (2013.01)

(58) Field of Classification Search
    CPC ... H01L 2224/80895; H01L 2924/1436; H01L 25/18; H01L 25/50
    See application file for complete search history.

(56) References Cited

U.S. PATENT DOCUMENTS

| | | | |
|---|---|---|---|
| 2010/0112753 A1 | 5/2010 | Lee | |
| 2015/0155163 A1* | 6/2015 | Kim | ............... H01L 29/7843 257/296 |
| 2019/0244892 A1 | 8/2019 | Zhu et al. | |
| 2020/0328180 A1* | 10/2020 | Cheng | ............... H01L 24/80 |
| 2020/0328181 A1* | 10/2020 | Liu | ............... H01L 25/18 |
| 2021/0111137 A1* | 4/2021 | Chen | ............... H01L 24/08 |

FOREIGN PATENT DOCUMENTS

| | | | |
|---|---|---|---|
| CN | 109983577 A | 7/2019 | |
| CN | 110870062 A | 3/2020 | |
| JP | 8-1 86235 A | 7/1996 | |
| JP | 8-227980 A | 9/1996 | |
| JP | 2017-511978 A | 4/2017 | |
| JP | 2017-532767 A | 11/2017 | |
| JP | 2018-160531 A | 10/2018 | |
| JP | 2019-165135 A | 9/2019 | |
| KR | 10-2015-0081393 A | 7/2015 | |
| KR | 10-2015-0133914 A | 12/2015 | |
| KR | 10-2018-0007811 A | 1/2018 | |
| TW | 200421497 A | 10/2004 | |
| TW | 200423261 A | 11/2004 | |

OTHER PUBLICATIONS

Extended European Search Report dated Jun. 14, 2022 in European Patent Application No. 20920028.6, 9 pages.
Japanese Office Action dated Nov. 7, 2022 in Japanese Patent Application No. 2021-559590, 6 pages.
Office Action dated Jan. 19, 2023, cited in corresponding Chinese Application No. 202110734431.0, filed on Feb. 20, 2020 (9 pgs.).
Office Action dated Feb. 23, 2023, in Korean Application No. 10-2021-7007807, with English translation.
Office Action dated Feb. 28, 2023, in Japanese Application No. 2021-572928, with English translation.
Communication dated Mar. 10, 2023, in European Patent Application No. 20920028.6.
Search Report dated Feb. 20, 2023, in Singapore Application No. 11202112524S.
Communication dated Feb. 14, 2023, in European Patent Application No. 18934860.0.

* cited by examiner

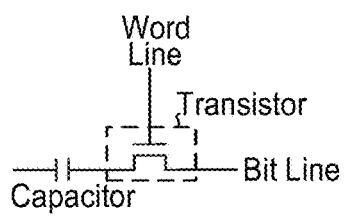
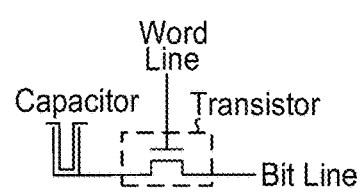
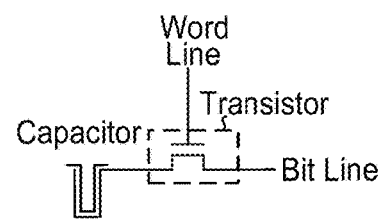
FIG. 1A  FIG. 1B  FIG. 1C
FIG. 2

DRAM MEMORY DEVICE WITH XTACKING ARCHITECTURE

RELATED APPLICATION

This application is a bypass continuation of International Application No. PCT/CN2020/075922, filed on Feb. 20, 2020. The entire disclosure of the prior application is hereby incorporated by reference in its entirety.

BACKGROUND

A dynamic random access memory (DRAM) is a type of random access semiconductor memory that stores each bit of data in a memory cell having a capacitor and an array transistor, both typically based on metal-oxide-semiconductor (MOS) technology. The capacitor can be set to either a charged or discharged state. These two states are taken to represent the two values of a bit, conventionally called zero and one. The DRAM also includes periphery transistors to form periphery circuits. The periphery circuits and the array transistors handle data input/output (I/O) as well as memory cell operations (e.g., writing or reading).

As DRAM technology migrates towards higher densities and high capacities, for example to a 10 nm node, the number of capacitors dramatically increases and the size of the capacitors dramatically reduces. The changes of the number and size of the capacitors can result in a longer process time and a more complex process flow.

SUMMARY

The concepts relate to formation of a DRAM memory device, for example a DRAM memory device having an Xtacking architecture. With the Xtacking architecture, the capacitors of the DRAM memory device are processed on an array wafer, and the periphery transistors and the array transistors of the DRAM memory device are processed on a separate periphery wafer using a logic technology node that enables the desired I/O speed and functions. Once the processing of the array wafer and the periphery wafer are completed, the two wafers are connected electrically through metal VIAs (Vertical Interconnect Accesses) that are formed across an interface between the wafers in one process step. By using the Xtacking technology, a higher storage density, a simpler process flower, and a less cycle time can be achieved.

According to an aspect of the present disclosure, a semiconductor device is provided that can include a first wafer having an array transistor formed therein and a second wafer having a capacitor structure formed therein. The semiconductor device also includes a bonding interface formed between the first wafer and second wafer that includes a plurality of bonding structures. The bonding structures are configured to couple the array transistor to the capacitor structure to form a memory cell.

In some embodiments, the first wafer can have a first substrate and the second wafer can have a second substrate. The first substrate has a first side and an opposing second side. The second substrate has a first side and an opposing second side. The array transistor can be positioned in the first side of the first substrate.

Additionally, the semiconductor device can include a first dielectric stack formed over the array transistor and positioned on the first side of the first substrate, and a plurality first contact structures formed in and extending through the first dielectric stack, where a first terminal contact of the first contact structures is coupled to a first doped region of the array transistor. The semiconductor device can also include a second dielectric stack formed on the first side of the second substrate so that the capacitor structure is positioned in the second dielectric stack, where a plurality of second contact structures are formed in and further extend through the second dielectric stack. The semiconductor device can include a third dielectric stack formed on the second side of the second substrate, and a through silicon contact (TSC) that is formed in the third dielectric stack. The TSC can extend from the second side of the second substrate through the second substrate to connect to a second terminal contact of the second contact structures.

The array transistor can further include a gate structure and a second doped region. The gate structure can be coupled a word line structure of the first contact structures, and the second doped region can be coupled to a bit line structure of the first contact structures.

The capacitor structure can have a cup-shaped bottom plate. The bottom plate can be formed in the second dielectric stack. The bottom plate further extends away from the first side of the second substrate and is coupled to a bottom plate contact of the second contact structures. The capacitor structure can also have an elongated top plate that is positioned within the bottom plate and coupled to a top plate contact of the second contact structures. A high-K layer is further positioned between the bottom plate and the top plate.

In some embodiments, the bottom plate contact and the first terminal contact can be bonded together, and the bit line structure and the second terminal contact can be bonded together.

The semiconductor device can further have a periphery transistor that is formed in the first side of the first substrate. The periphery transistor can have a gate structure that is connected to a gate contact of the first contact structures, a source region that is connected to a source contact of the first contact structures, and a drain region that is connected to a drain contact of the first contact structures. Each of the gate contact, the source contact, and the drain contact can be bonded to a respective second contact structure.

In another embodiment, the semiconductor device can have a periphery transistor that is formed in the first side of the second substrate. Accordingly, the periphery transistor has a gate structure that is connected to a gate contact of the second contact structures, a source region that is connected to a source contact of the second contact structures, and a drain region that is connected to a drain contact of the second contact structures. Each of the gate contact, the source contact, and the drain contact is bonded to a respective first contact structure.

According to another aspect of the disclosure, a method for manufacturing a semiconductor device is provided. In the disclosed method, an array transistor can be formed in a first side of a first substrate. A first dielectric stack is formed over the array transistor and positioned on the first side of the first substrate, and a plurality first contact structures are formed in the first dielectric stack, where the array transistor is coupled to at least one of the first contact structures. In addition, a capacitor structure can be further formed over a first side of a second substrate. A second dielectric stack is formed on the first side of the second substrate and a plurality of second contact structures are formed in the second dielectric stack, where the capacitor structure is coupled to at least one of the second contact structures, and the capacitor structure is positioned in the second dielectric stack. The first substrate and the second substrate can be subsequently bonded together through a plurality of bonding structures so that the capacitor structure is coupled to the array transistor, and the first side of the first substrate and the first side of the second substrate face to each other.

The method can also include forming a periphery transistor in the first side of the first substrate. The periphery transistor can include a gate structure that is connected to a gate contact of the first contact structures, a source region that is connected to a source contact of the first contact structures, and a drain region that is connected to a drain contact of the first contact structures, where each of the gate contact, the source contact, and the drain contact is bonded to a respective second contact structure.

In some embodiments, forming the array transistor can include forming a gate structure, a first doped region, and a second doped region. The gate structure can be coupled a word line structure of the first contact structures, the first doped region can be coupled to a first terminal contact of the first contact structures, and the second doped region can be coupled to a bit line structure of the first contact structures.

In some embodiments, a portion of the second substrate can be removed from a second side that is opposite to the first side of the second substrate. A third dielectric stack subsequently can be formed over the second side of the second substrate. A through silicon contact (TSC) can be formed in the third dielectric stack. The TSC can extend from the second side of the second substrate and further extend through the second substrate to connect to a second terminal contact of the second contact structures.

In order to form the capacitor structure, a cup-shaped bottom plate can be formed. The bottom plate can be arranged in the second dielectric stack and extend away from the first side of the second substrate to connect to a bottom plate contact of the second contact structures. Further, an elongated top plate can be formed. The top plate can be positioned within the bottom plate and coupled to a top plate contact of the second contact structures. A high-K layer can be positioned between the bottom plate and the top plate.

In some embodiments, bonding the first substrate and the second substrate can include bonding the bottom plate contact and the first terminal contact together so that the capacitor structure is coupled to the first doped region of the array transistor, and bonding the bit line structure and the second terminal contact together so that the TSC is coupled to the second doped region of the array transistor.

In the disclosed method, a periphery transistor can also be formed in the first side of the second substrate. The periphery transistor can have a gate structure that is connected to a gate contact of the second contact structures, a source region that is connected to a source contact of the second contact structures, and a drain region that is connected to a drain contact of the second contact structures. Each of the gate contact, the source contact, and the drain contact is further bonded to a respective first contact structure.

According to yet another aspect of the disclosure, a semiconductor device is provided. The semiconductor device can have a first array region and a first periphery region that are formed over a first side of a first substrate. The first array region has at least one array transistor formed in the first side of the first substrate, and the first periphery region has at least one periphery transistor formed in the first side of the first substrate. The semiconductor device can have a second array region and a second periphery region that are formed over a first side of a second substrate. The second array region has at least one capacitor structure formed over the first side of the second substrate, and the at least one capacitor structure can be coupled to a first doped region of the at least one array transistor. The first side of the first substrate and the first side of the second substrate face each other. The semiconductor device can also have a plurality of bonding structures that are configured to bond the first array region to the second array region, and bond the first periphery region to the second periphery region.

The semiconductor device can have a first dielectric stack formed over the at least one array transistor on the first side of the first substrate, and a plurality first contact structures formed in and extending through the first dielectric stack, where a first terminal contact of the first contact structures is coupled to a first doped region of the at least one array transistor. The semiconductor device can also have a second dielectric stack that is formed on the first side of the second substrate so that the at least one capacitor structure is positioned in the second dielectric stack, and a plurality of second contact structures that are formed in and extend through the second dielectric stack. The semiconductor device can further have a third dielectric stack formed on a second side of the second substrate and at least one through silicon contact (TSC) formed in the third dielectric stack. The second side of the second substrate is opposite to the first side of the second substrate. The TSC can extend from the second side of the second substrate through the second substrate to connect to a second terminal contact of the second contact structures.

In some embodiments, the at least one array transistor can further include a gate structure that is coupled a word line structure of the first contact structures, and a second doped region that is coupled to a bit line structure of the first contact structures. In some embodiments, the at least one capacitor structure can further include a cup-shaped bottom plate, an elongated top plate, and a high-K layer. The bottom plate is formed in the second dielectric stack, extends away from the first side of the second substrate and coupled to a bottom plate contact of the second contact structures. The elongated top plate is positioned within the bottom plate and coupled to a top plate contact of the second contact structures. The high-K layer is positioned between the bottom plate and the top plate. The bottom plate contact and the first terminal contact are bonded together, and the bit line structure and the second terminal contact are bonded together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 1A is a schematic view of a DRAM memory device formed in a flat configuration, in accordance with exemplary embodiments of the disclosure.

FIG. 1B is a schematic view of a DRAM memory device formed in a stack configuration, in accordance with exemplary embodiments of the disclosure.

FIG. 1C is a schematic view of a DRAM memory device formed in a trench configuration, in accordance with exemplary embodiments of the disclosure.

FIG. 2 is a process flow for manufacturing a DRAM memory device, in accordance with exemplary embodiments of the disclosure.

FIGS. 7, 8, 11 and 12 are cross-sectional views of second intermediate steps of manufacturing the first exemplary DRAM memory device, in accordance with exemplary embodiments of the disclosure.

DETAILED DESCRIPTION

Figure 3:
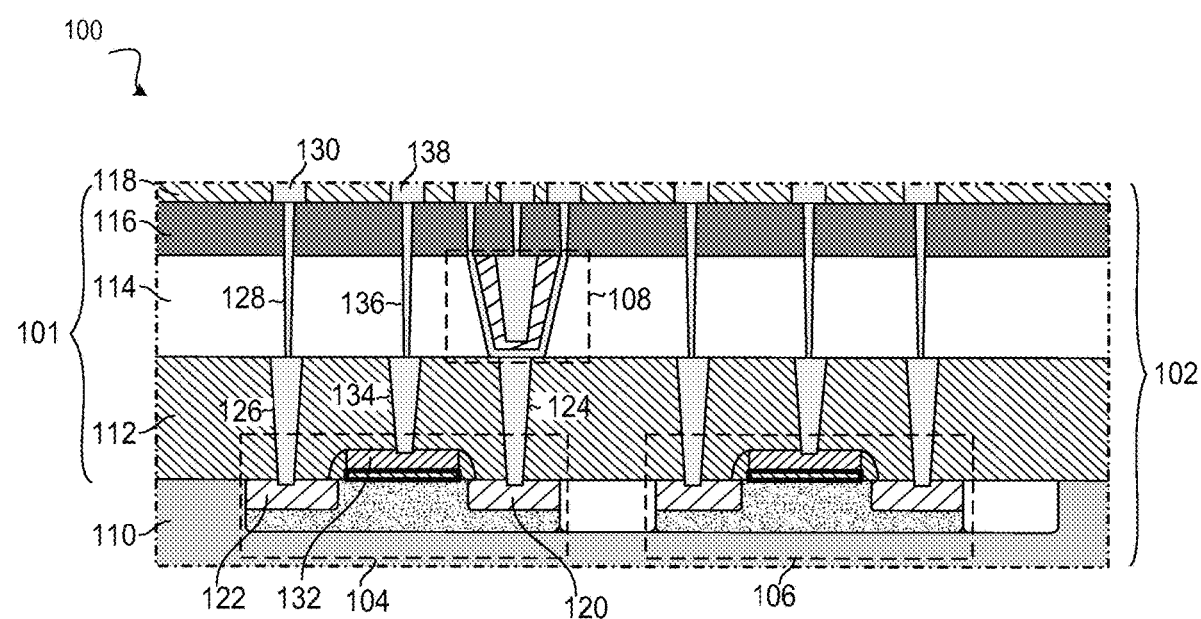
FIG. 3 is a cross-sectional view of a DRAM memory device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A DRAM memory device can include an array region and a periphery region. The array region can include a plurality of DRAM memory cells. Each of the DRAM memory cells can be formed of a capacitor and an array transistor, both typically based on metal-oxide-semiconductor (MOS) technology. The capacitor can either be charged or discharged. These two states are taken to represent the two values of a bit, conventionally called zero and one. The capacitor can be formed in a flat configuration, a stack configuration, or a trench configuration depending on manufacturing methods. The capacitor can be coupled to a first dope region (e.g., a drain region) of the array transistor to be charged or discharged through the first dope region. A word line can be coupled to a gate of the array transistor to turn on or turn off the array transistor. A bit line can be coupled to a second doped region (e.g., a source region) of the array transistor and function as a path for charging or discharging the capacitor.

The periphery region can include a plurality of periphery transistors to form periphery circuits configured to operate the DRAM memory cells, such as writing or reading the DRAM memory cells. The periphery circuits can include row decoders, column decoders, input/output controllers, multiplexers, sense amplifiers, or the like. The row decoders are coupled to word lines of the DRAM memory cells and configured to turn on or turn off gates of the array transistors. The column decoders are coupled to bit lines of the DRAM memory cells and configured to read or write the DRAM memory cells. The input/output controllers are configured to control the input and output signals. The multiplexers are data selectors and configured to select an input signal between several input signals and forward the selected input signal to a single output line. The sense amplifiers are configured to sense low power signals from a bit line that represents a data bit (zero or one) stored in a DRAM memory cell, and amplify the small voltage swing to recognizable logic levels so the data can be interpreted properly by logic outside the DRAM memory device.

FIG. 1A is a schematic view of a DRAM memory cell formed in a flat configuration, where the capacitor is formed over and extend along a top surface of substrate (not shown). FIG. 1B is a schematic view of a DRAM memory device formed in a stack configuration, where the capacitor is formed in a dielectric stack that is positioned over a substrate (not shown). FIG. 1C is a schematic view of a DRAM memory device formed in a trench configuration, where the capacitor is positioned in the substrate (not shown). Comparing with the DRAM memory cell in FIG. 1A, the DRAM memory cells in FIGS. 1B-1C can reduce the DRAM memory cell's size and increase the storage density of the DRAM memory device.

FIG. 2 is a process flow for manufacturing a DRAM memory device. As shown in FIG. 2, the array transistors, the periphery transistors, and the capacitors are processed sequentially in a same wafer. As DRAM technology migrates towards higher densities and high capacities, manufacturing the DRAM memory device requires longer process time, and a more complex process flow.

FIG. 3 is a cross-sectional view of a DRAM memory device 100 (also referred to as device 100) that has capacitors formed in the stack configuration, and the capacitors, the array transistors and the periphery transistors are formed in a same wafer. For simplicity and clarity, an array transistor 104, a periphery transistor 106, and a capacitor 108 are illustrated in FIG. 3. As shown in FIG. 3, the array transistor 104, the periphery transistor 106, and the capacitor 108 are formed in a same wafer 102. The wafer 102 can have a substrate 110. The substrate 110 may be a semiconductor substrate, such as Si substrate. The array transistor 104 and the periphery transistor 106 are positioned in the substrate 110. A dielectric stack 101 is formed over the substrate 110. The dielectric stack 101 can include one or more dielectric layers. In an exemplary embodiment of FIG. 3, the dielectric stack 101 can include four inter layer dielectric (ILD) layers 112-118. The capacitor 108 is formed in the dielectric stack 101.

In some embodiments, the ILD layers 112-118 can include one of borophosphosilicate glass (BPSG), undoped silicate glass (USG), phosphosilicate glass (PSG), Tetraethylorthosilicate (TEOS), $SiH_4$ Oxide, $SiO_2$, spin on dielectric (SOD) or other suitable dielectrics. The ILD layers 112-118 can have a thickness in a range 10 nm from to 10 um.

The array transistor 104 can have a first doped region (e.g., drain region) 120 that is coupled to the capacitor 108 through a contact structure 124. The array transistor 104 can have a second doped region (e.g., source region) 122 that is coupled to a bit line through a first connection channel. The first connection channel can be formed of a contact structure 126, a Via 128, and a first metal (M1) layer 130. The array transistor 104 can have a gate 132 that is coupled to a word line through a second connection channel. The second connection channel can be formed of a contact 134, a Via 136, and a M1 layer 138.

In the present disclosure, a DRAM memory device is formed based on a Xtacking architecture. With the Xtacking architecture, in a first embodiment, the capacitors of the DRAM memory device are processed on an array wafer, and the periphery transistors and the array transistors of the DRAM memory devices are processed on a separate periphery wafer using the logic technology node. In alternative embodiments, the capacitors and the periphery transistors of the DRAM memory device can be processed on the periphery wafer, and the array transistor can be processed on the array wafer.

Figure 4A:
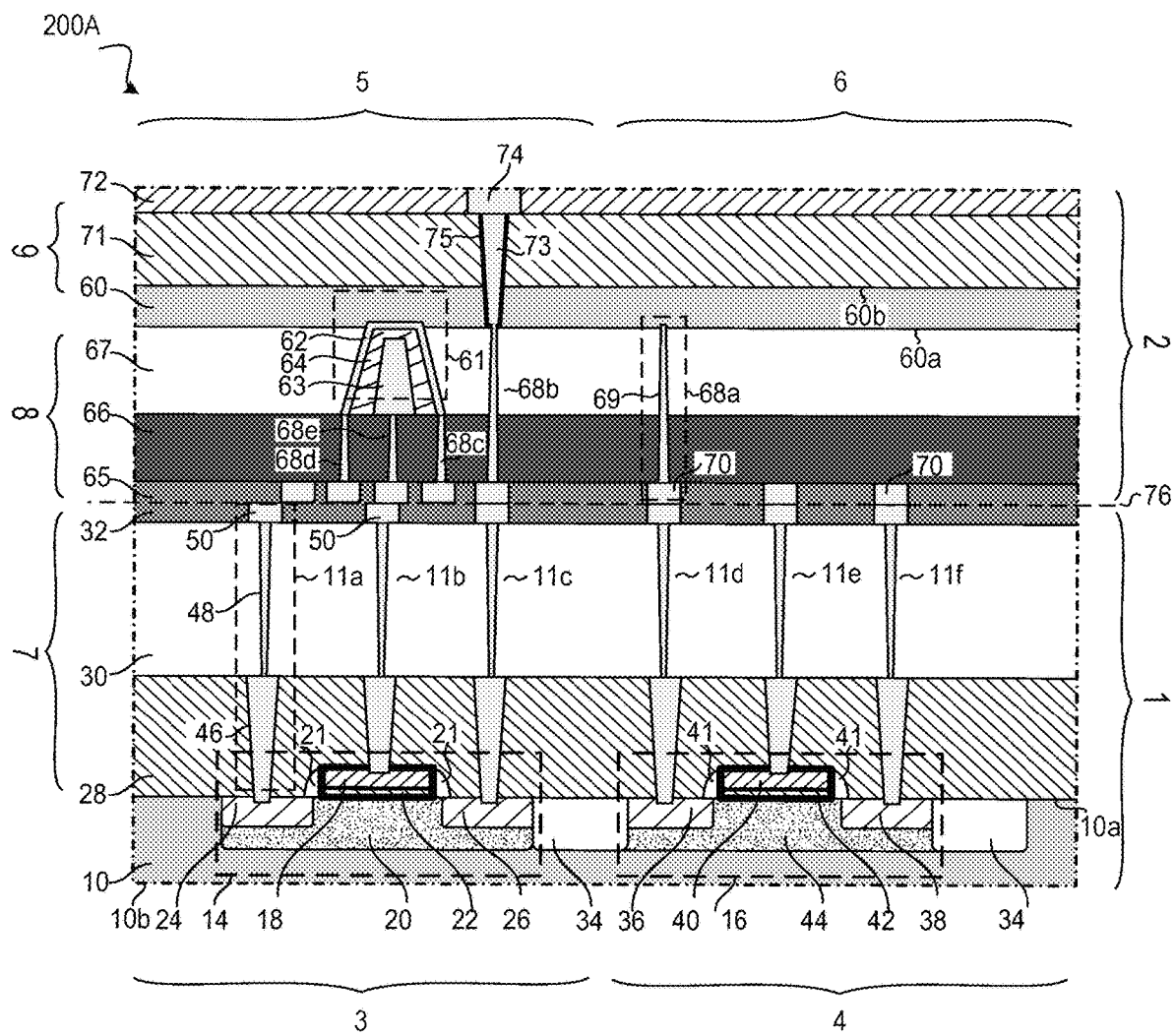
FIG. 4A is a cross-sectional view of a first exemplary DRAM memory device, in accordance with exemplary embodiments of the disclosure.
Figure 4B:
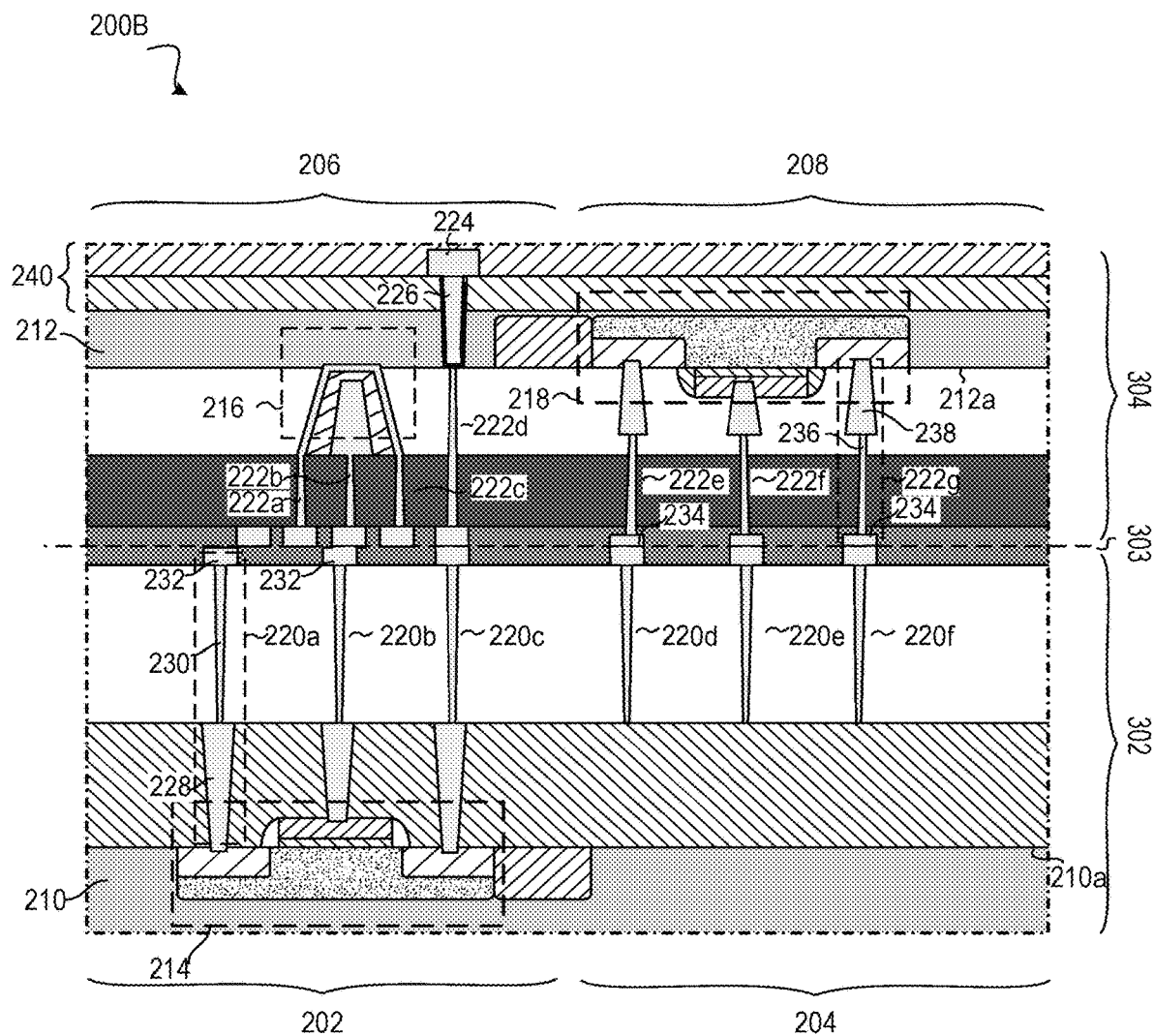
FIG. 4B is a cross-sectional view of a second exemplary DRAM memory device, in accordance with exemplary embodiments of the disclosure.

FIG. 4A is a cross-sectional view of a first exemplary DRAM memory device 200A (also referred to as device 200A), and FIG. 4B is a cross-sectional view of a second exemplary DRAM memory device 200B (also referred to as device 200B). The devices 200A and 200B are formed based on the Xtacking architecture. As shown in FIG. 4A, the device 200A can have a first array region 3 and a first periphery region 4 formed in a first wafer 1, and a second array region 5 and a second periphery region 6 formed in a second wafer 2. The first wafer 1 can have a first substrate 10 and the second wafer 2 can have a second substrate 60. The first substrate 10 can have a first side 10a and an opposing second side 10b. The second substrate 60 can have a first side 60a and an opposing second side 60b.

The first array region 3 and the first periphery region 4 are formed over the first side 10a of a first substrate 10. The first array region 3 can have a plurality of array transistors, and the first periphery region 4 can have a plurality of periphery transistors. For simplicity and clarity, an array transistor 14 and a periphery transistor 16 are illustrated in FIG. 4A. The array transistor 14 and the periphery transistor 16 can be formed in the first side 10a of the first substrate 10, and spaced apart from one another by a shallow trench isolation (STI) 34.

The array transistor 14 can have a first doped region (e.g., a drain region) 24 and a second doped region (e.g., a source region) 26 that are formed in the first substrate 10. The array transistor 14 can have a gate structure 18 that is positioned over the first side 10a of the first substrate 10, and a p-typed doped well (PW) 20 that is positioned in the first substrate 10 and functions as a body of the array transistor 14. A gate dielectric layer 22 is positioned between the gate structure 18 and the PW 20. Dielectric spacers 21 can be positioned along sidewalls of the gate structure 18 and the gate dielectric layer 22.

The periphery transistor 16 can be an n-type transistor or a p-type transistor according to the circuit design. The periphery transistor 16 can have a first source/drain (S/D) region 36 and a second S/D region 38 that are positioned in the first substrate 10. The periphery transistor 16 can have a gate structure 40 positioned over the first substrate 10, and a doped well region 44 positioned in the first substrate 10 and functions as a body of the periphery transistor 16. A gate dielectric layer 42 is positioned between the gate structure 40 and the doped well region 44. The doped well region 44 can have a n-type dopant or a p-type dopant according to the structures of the periphery transistor 16. Dielectric spacers 41 can be positioned along sidewalls of the gate structure 40 and the gate dielectric layer 42.

In the device 200A, a first dielectric stack 7 is formed over the array transistor 14 and positioned on the first side 10a of the first substrate 10. The first dielectric stack 7 can include a plurality of ILD layers. For example, three ILD layers 28, 30 and 32 are illustrated in FIG. 4A. A plurality of first contact structures can be formed in and further extend through the first dielectric stack 7. In an exemplary embodiment of FIG. 4A, six first contact structures 11a-11f are included. Each of the first contact structures 11a-11f can include a contact 46, a Via 48, and a M1 layer 50. The first contact structures 11a-11f can include a first terminal contact 11a that is coupled to the first doped region 24 of the array transistor 14. The first contact structures 11a-11f can also include a word line structure 11b that is coupled to the gate structure 18 of the array transistor 14. The first contact structures 11a-11f can further include a bit line structure 11c that is coupled to the second doped region 26 of the array transistor 14. The first contact structures 11d, 11e, and 11f can further be coupled to the first S/D region 36, the gate structure 40, the second S/D region 38 of the periphery transistor 16 respectively. Accordingly, the first contact structure 11d functions as a first S/D contact, the first contact structure 11f functions as a second S/D contact, and the first contact structure 11e functions as a gate contact of the periphery transistor 16.

In some embodiments, the ILD layers 28, 30 and 32 can include BPSG, USG, PSG, TEOS, $SiH_4$ Oxide, $SiO_2$, SOD or other suitable dielectric materials. The ILD layers 28, 30 and 32 can have a thickness in a range 10 nm from to 10 um. Any suitable manufacturing processes can be applied to form the ILD layers 28, 30 and 32, such as a CVD process, a PVD process, an atomic layer deposition (ALD) process, a diffusion process, a sputter process, or a combination thereof.

Still referring to FIG. 4A, the second array region 5 and the second periphery region 6 are formed over the first side 60a of the second substrate 60. The second array region 5 can have a plurality of capacitor structures formed over the first side 60a of the second substrate 60. For simplicity and clarity, a capacitor structure 61 is illustrated in FIG. 4A. Further, a second dielectric stack 8 can be formed on the first side of 60a the second substrate 60 so that the capacitor structures, such as the capacitor structure 61, are positioned in the second dielectric stack 8. The second dielectric stack 8 can have a plurality of ILD layers. For example, three ILD layers 65, 66 and 67 are included in FIG. 4A. The capacitor structure 61 can have a cup-shaped bottom plate 62 that is disposed in the second dielectric stack 8 and further extend away from the first side 60a of the second substrate 60. The capacitor structure 61 can have an elongated top plate 63 that is positioned within the bottom plate 62. A high-K layer 64 is positioned between the bottom plate 62 and the top plate 63. In some embodiments, top surfaces of the bottom plate 62, the top plate 63, and the high-K layer 64 can be co-planar.

In some embodiments, the ILD layers 65-67 can include BPSG, USG, PSG, TEOS, $SiH_4$ Oxide, $SiO_2$, SOD or other suitable dielectric materials. The ILD layers 65-67 can have a thickness in a range 10 nm from to 10 um. Any suitable manufacturing processes can be applied to form the ILD layers 65-67, such as a CVD process, a PVD process, an ALD process, a diffusion process, a sputter process, or a combination thereof.

Over the first side 60a of the second substrate 60, a plurality of second contact structures are positioned in and further extend through the second dielectric stack 8. For example, five second contact structures 68a-68e are illustrated in FIG. 4A. Each of the second contact structures can have a VIA 69 and a M1 layer 70 that are connected to each other. The second contact structures 68a-68e can include one or more bottom plate contacts 68c-68d that are coupled to the bottom plate 62. The second contact structures 68a-68e can include a top plate contact 68e that is coupled to the top plate 63. In some embodiments, the top plate contact 68e can be supplied with a constant voltage, such as 0.5 volt. The bottom plate contacts 68c-68d can be connected to the bottom plate 62. The bottom plate contact 68c-68d can further be coupled to the first terminal contact 11a of the first contact structures 11a-11f so that the capacitor structure 61 is coupled to the first doped region 24 of the array transistor 14.

The device 200A can have a third dielectric stack 9 formed on the second side 60b of the second substrate 60. The third dielectric stack 9 can include a plurality of ILD layers. For example, two ILD layers 71 and 72 are illustrated in FIG. 4A. In some embodiments, the ILD layers 71 and 72 can include SiN, TEOS, $SiH_4$ Oxide, $SiO_2$ or other suitable dielectric materials. Further, a plurality of through silicon contacts (TSCs) can be formed in the third dielectric stack 9. The TSCs can further extend from the second side 60b of the second substrate 60 through the second substrate 60 to connect to the second contact structures. The device 200A can also have a plurality of bottom top metals (BTMs) that function as bonding pad and positioned on the TSCs. In an exemplary embodiment of FIG. 4A, a TSC 73 and a BTM 74 are illustrated, where the BTM 74 can be positioned on the TSC 73 and function as a bonding pad. The TSCs can be connected to the second contact structures. For example, the TSC 73 can be connected to the second contact structure 68b. In some embodiments, a barrier layer 75 can be disposed between the TSC 73 and the third dielectric stack 9 and the second substrate 60.

In the device 200A, a bonding interface 76 is formed between the first wafer 1 and the second wafer 2 that includes a plurality of bonding structures (not shown). The bonding structures (not shown) can be positioned on the M1 layers 50 and/or the M1 layers 70. The bonding structures can include Cu, Ni, SnAg, or other suitable bonding materials. The bonding structures are configured to bond the first wafer 1 and the second wafer 2 together by bonding the M1 layers 50 to the M1 layers 70. Accordingly, the first contact structures 11a-11f are coupled to the second contact structures 68a-68e, the first array region 3 is coupled to the second array region 5, and the first periphery region 4 is coupled to the second periphery region 6. In addition, the first side 10a of the first substrate 10 and the first side 60a of the second substrate 60 face each other.

The coupling between the first wafer 1 and the second wafer 2 can be illustrated in FIG. 4A. In a first example, the bit line structure 11c of the first contact structures is bonded to the second contact structure (or the second terminal contact) 68b. Thus, the TSC 73 can be coupled to the second doped region 26 of the array transistor 14 through the bit line structure 11C and the second contact structure 68b. Accordingly, an operation voltage can be applied to the second doped region 26 of the array transistor 14 through a connection channel formed of the BTM 74, the TSC 73, the bit line structure 11C and the second contact structure 68B. In a second example, the bottom plate contacts 68c-68d can be bonded to the first terminal contact 11a so that the capacitor structure 61 is coupled to the first doped region (e.g., a drain region) of the array transistor 14.

In some embodiments, the first substrate 10 and the second substrate 60 can be a semiconductor substrate such as Si substrate. The first substrate 10 and the second substrate 60 may also include other semiconductors such as germanium (Ge), silicon carbide (SiC), silicon germanium (SiGe), or diamond. The gate dielectric layers 22 and 42 can be made of SiO, HfO, a high-K dielectric material, or other suitable dielectric materials. The gate structures 18 and 40 can be made of poly Si, W, WN, Ti, TiN, TaN, AlTiC, AlTiO, AlTiN, or other suitable materials. The contacts 46 and 69 can be made of W, Ru, Co, or other suitable conductive materials. The Via 48, the M1 layer 50 and the M1 layer 70 can be made of Cu, Al, Ru, Co, W, or other suitable conductive materials. The first dielectric stack 7, the second dielectric stack 8 and the third dielectric stack 9 can include SiO, TEOS, USG, PSG, BPSG, SiN, SiCN or other suitable dielectric Materials. The bottom plate 62 and the top plate 63 can include Ti, TiN, poly Si, or other suitable conductive materials. The high-K layer 64 can include HfO, AlO, ZrO, or other suitable high-K dielectric materials. The TSC 73 and the BTM 74 can be made of Cu, Al, W or other suitable conductive materials. The barrier layer 75 can be made of TEOS, SiO, or other suitable dielectric materials.

FIG. 4B is a cross-sectional view of a second exemplary DRAM memory device 200B. The device 200B has a similar structure to the device 200A. For example, the device 200B has a first wafer 302 and a second wafer 304. The first wafer 302 has a first array region 202 and a first periphery region 204 that formed over a first side 210a of a first substrate 210. The second wafer 304 has a second array region 206 and a second periphery region 208 that are formed over a first side 212a of a second substrate 212. An exemplary array transistor 214 is formed in the first substrate 210 and positioned in the first array region 202. An exemplary capacitor structure 216 is positioned in the second array region 206. However, comparing to the device 200A, periphery transistors, such as an exemplary periphery transistor 218, are formed in the second substrate 212 and positioned in the second periphery region 208.

The first wafer 302 can have a plurality of first contact structures 220a-220f. The second wafer 304 can have a plurality of second contact structures 222a-222g. A bonding interface 303 can be formed between the first wafer 302 and the second wafer 304 that includes a plurality of bonding structures (not shown). The bonding structures (not shown) can be positioned on M1 layers 232 and/or M1 layers 234.

The first contact structures 220a-220f and the second contact structures 222a-222g can be bonded to each other through the bonding structures so that the first array region 202 and the second array region 206 are coupled to each other, and the first periphery region 204 and the second periphery region 208 are coupled to each other. For example, the first contact structures 220d-220f in the first periphery region 204 are bonded to the second contact structures 222e-222g. The second contact structures 222e-222g are further connected to the periphery transistor 218. Accordingly, the first contact structures 220d-220f in the first periphery region 204 are coupled to the periphery transistor 218 in the second periphery region 208. Similar to device 200A, a TSC 226 extends through the second substrate 212 to connect to the second contact structure 222d. The TSC 226 further is coupled to the array transistor 214 through a connection channel that is formed of the second contact structure 222d and the first contact structure 220c.

It should be noted that the capacitor structure in device 200A or 200B is formed in a stack configuration. However, the capacitor structure can also be formed in a flat configuration or a trench configuration.

Figure 5A:
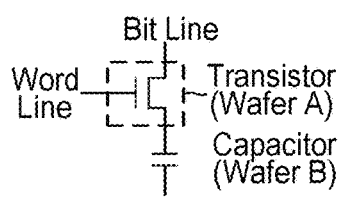
FIG. 5A is a schematic view of a memory cell in the first exemplary DRAM memory device, in accordance with exemplary embodiments of the disclosure.

FIG. 5A is a schematic view of a memory cell in the first exemplary DRAM memory device 200A. As shown in FIG. 5A, the array transistor (also referred to as transistor in FIG. 5A) is processed in a first wafer (e.g., wafer A) and the capacitor is processed in a second wafer (e.g., wafer B). A drain region of the array transistor can be coupled to a bit line, and a source region of the array transistor can be coupled to the capacitor. A gate of the array transistor is coupled to a word line.

Figure 5B:
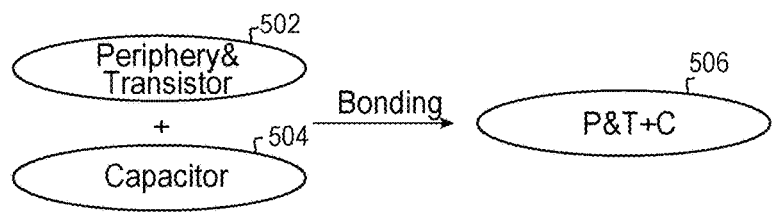
FIG. 5B is a schematic view of a first process flow for making the first exemplary DRAM memory device, in accordance with exemplary embodiments of the disclosure.

FIG. 5B is a schematic view of a first process flow for making the first exemplary DRAM memory device 200A. As shown in FIG. 5B, a periphery (or periphery region) of the device 200A that includes periphery transistors can be process with the array transistors in a first wafer 502. In the meanwhile, capacitors of the device 200A can be process in a second wafer 504. The first wafer 502 and the second wafer 504 can be bonded together to form the DRAM memory device 200A in a bonded wafer 506 that has the Xtacking architecture.

Figure 5C:
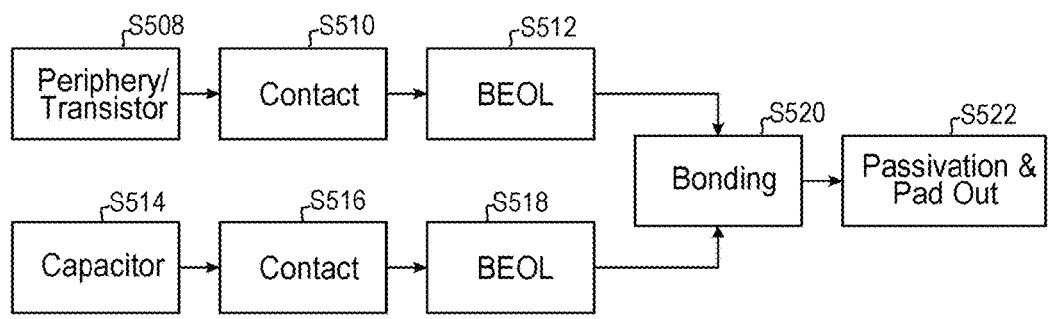
FIG. 5C is a schematic view of a second process flow for making the first exemplary DRAM memory device, in accordance with exemplary embodiments of the disclosure.

FIG. 5C is a schematic view of a second process flow for making the first exemplary DRAM memory device 200A, in accordance with exemplary embodiments of the disclosure. At step S508, the periphery transistors (e.g., periphery transistor 16) and array transistors (e.g., array transistor 14) can be formed in a first wafer (e.g., the first wafer 1). The first wafer can then be sent on to form the contacts (e.g., contact 46) in step S510. At step S512, the first wafer can then be sent on for receiving a back end of line (BEOL) process, where Vias (e.g., Via 48) and metal layers (e.g., M1 layers 50) can be formed over the contacts. In the meanwhile, capacitors (e.g., capacitor structure 61) can be formed in a second wafer (e.g., the second wafer 2) at step S514. The second wafer can then be sent on to form contacts (e.g., VIA 69) at step S516. Subsequently, at step S518 the second wafer can be sent on for receiving a BEOL process to form metal layers (e.g., M1 layers 70). At step S520, the first wafer and the second wafer can be bonded together. At step S522, passivation layers (e.g., the third dielectric stack 9) and bonding pad (e.g., TSC 73 and BTM 74) can be formed.

Figure 6A:
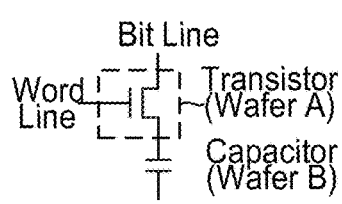
FIG. 6A is a schematic view of a memory cell in the second exemplary DRAM memory device, in accordance with exemplary embodiments of the disclosure.

FIG. 6A is a schematic view of a memory cell in the second exemplary DRAM memory device 200B. As shown in FIG. 6A, the array transistor (also referred to as transistor in FIG. 6A) is processed in a first wafer (e.g., wafer A) and the capacitor is processed in a second wafer (e.g., wafer B). A drain region of the array transistor is coupled to a bit line, and a source region of the array transistor is coupled to the capacitor. A gate of the array transistor is coupled to a word line.

Figure 6B:
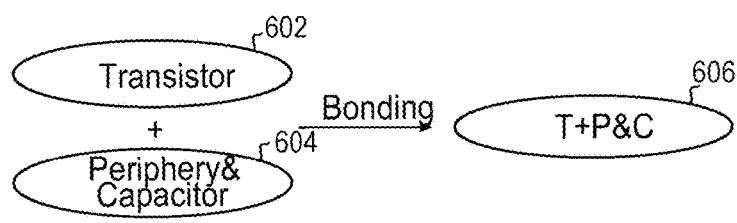
FIG. 6B is a schematic view of a first process flow for making the second exemplary DRAM memory device, in accordance with exemplary embodiments of the disclosure.

FIG. 6B is a schematic view of a first process flow for making the second exemplary DRAM memory device 200B. As shown in FIG. 6B, a periphery (or periphery region) of the device 200B that includes periphery transistors can be processed with capacitors in a first wafer 604. In the meanwhile, transistors (or array transistors) of the device 200B can be processed in a second wafer 602. The first wafer 604 and the second wafer 602 can be bonded together to form the DRAM memory device 200B in a bonded wafer 606 that has the Xtacking architecture.

Figure 6C:
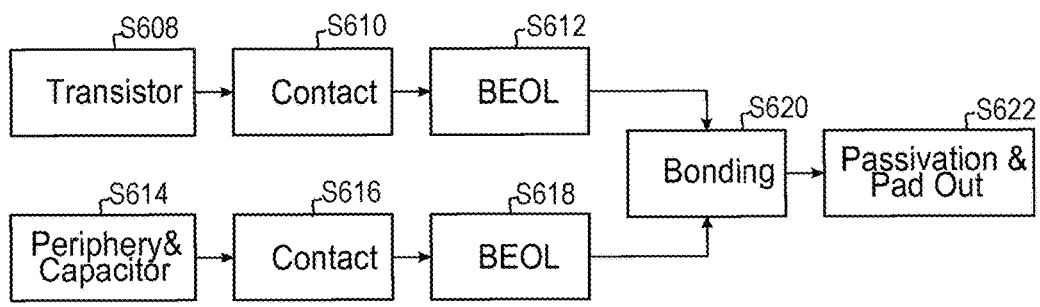
FIG. 6C is a schematic view of a second process flow for making the second exemplary DRAM memory device, in accordance with exemplary embodiments of the disclosure.

FIG. 6C is a schematic view of a second process flow for making the second exemplary DRAM memory device 200B (or device 200B). At step S608, the array transistors (e.g., array transistor 214) can be formed in a first wafer (e.g., the first wafer 302). The first wafer can then be sent on to form the contacts (e.g., contact 228) in step S610. At step 612, the first wafer can then be sent on for receiving a back end of line (BEOL) process, where Vias (e.g., Via 230) and metal layers (e.g., M1 layers 232) can be formed over the contacts. In the meanwhile, capacitors (e.g., capacitor structure 216) and periphery transistors (e.g., 218) can be formed in a second wafer (e.g., the second wafer 304) at step S614. The second wafer can then be sent on to form contacts (e.g., contact 238, Via 236) at step S616. Subsequently, at step S618 the second wafer can be sent on for receiving a BEOL process to form metal layers (e.g., M1 layers 234). At step S620, the first wafer and the second wafer can be bonded together. At step S622, passivation layers (e.g., the third dielectric stack 240) and bonding pad (e.g., TSC 226 and BTM 224) can be formed.

Figure 7:
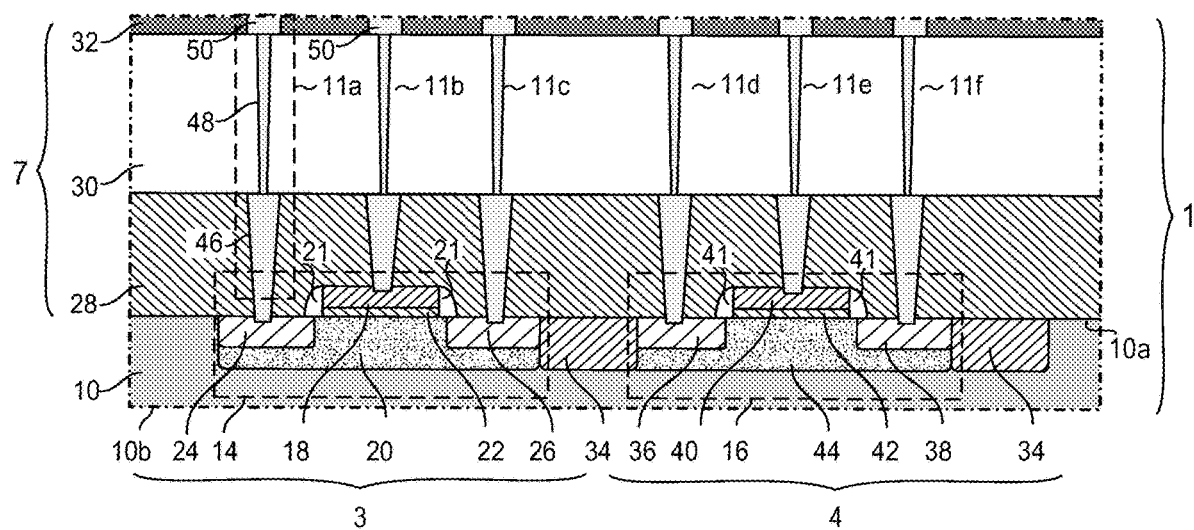
FIGS. 7-10 are cross-sectional views of first various intermediate steps of manufacturing the first exemplary DRAM memory device, in accordance with exemplary embodiments of the disclosure.

FIGS. 7-10 are cross-sectional views of first various intermediate steps of manufacturing the first exemplary DRAM memory device 200A, in accordance with exemplary embodiments of the disclosure. As shown in FIG. 7, a first array region 3, and a first periphery region 4 are formed in a first wafer 1. The first array region 3 can include a plurality of array transistors, and a plurality of periphery transistors. For simplicity and clarity, an array transistor 14 and a periphery transistor 16 are illustrated in FIG. 7. The first wafer 1 can have a first substrate 10 that include a first side 10a and an opposing second side 10b. A first dielectric stack 7 can be formed over the array transistors 14 and the periphery transistor 16 and positioned on the first side 10a of the first substrate 10. The first dielectric stack 7 can include one or more dielectric layers, such as three ILD layers 28, 30 and 32 that are illustrated in FIG. 7.

A plurality of first contact structures 11a-11f can be formed in the first dielectric stack 7 and coupled to the array transistor 14 and the periphery transistor 16. For example, the first contact structures 11a-11f can include a first terminal contact 11a that is coupled to a first doped region 24 of the array transistor 14. The first contact structures 11a-11f can also include a word line structure 11b that is coupled to a gate structure 18 of the array transistor 14. The first contact structures 11a-11f can further include a bit line structure 11c that is coupled to a second doped region 26 of the array transistor 14. The first contact structures 11d, 11e, and 11f can further be coupled to a first S/D region 36, a gate structure 40, and a second S/D region 38 of the periphery transistor 16 respectively. Accordingly, the first contact structures 11d and 11f function as S/D contacts, and the first contact structure 11e functions as a gate contact of the periphery transistor 16.

In order to produce the first wafer 1 mentioned above, various semiconductor manufacturing processes can be applied. The semiconductor manufacturing processes can include a deposition process, a photolithograph process, an etching process, a wet clean process, a metrology measurement process, a real-time defect analysis, a surface planarization process, an implantation process, or the like. The deposition process further can include a chemical vapor deposition (CVD) process, a physical vapor deposition (PVD) process, a diffusion process, a sputtering process, an atomic layer deposition (ALD) process, an electroplating process, and so on.

For example, the implantation process can be applied to form a p-typed doped well (PW) 20, the first doped region 24 and the second doped region 26 of the array transistor 14. The deposition process can be applied to form a gate dielectric layer 22, a gate structure 18 and spacers 21 of the array transistor 14. The first dielectric stack 7 can be formed by the deposition process. In order to form the first contact structures 11a-11f in the first dielectric stack 7, a plurality of contact openings (not shown) can be formed by applying the photolithography process and the etching process. The deposition process can be subsequently applied to fill the contact openings with conductive materials. The surface planarization process can then be applied to remove excessive conductive materials over a top surface of the first dielectric stack 7.

Figure 8:
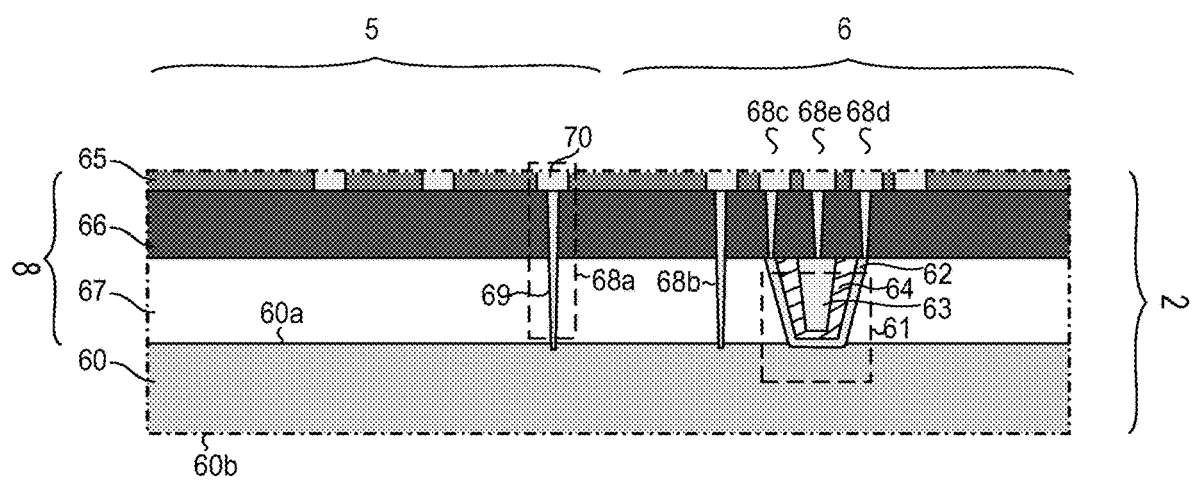

In FIG. 8, a second array region 5 and a second periphery region 6 are formed over a first side 60a of a second substrate 60 in a second wafer 2. A capacitor structure 61 can be formed in the second array region 5. The second substrate 60 can have the first side 60a and an opposing second side 60b. A second dielectric stack 8 can be formed over the first side 60a of the second substrate 60. The second dielectric stack 8 can include one or more ILD layers 65-67. The capacitor structure 61 can be positioned over the first side 60a of the second substrate 60 and disposed in the second dielectric stack 8. The capacitor structure 61 can have a cup-shaped bottom plate 62 that is disposed in the second dielectric stack 8 and further extend away from the first side 60a of the second substrate 60. The capacitor structure 61 can have an elongated top plate 63 that is positioned within the bottom plate 62. A high-K layer 64 is positioned between the bottom plate 62 and the top plate 63. In some embodiments, top surfaces of the bottom plate 62, the top plate 63, and the high-K layer 64 can be co-planar.

In the second wafer 2, a plurality of second contact structures 68a-68e can be formed in the second dielectric stack 8. The second contact structures 68a-68e can include one or more bottom plate contacts 68c-68d that are coupled to the bottom plate 62. The second contact structures 68a-68e can also include a top plate contact 68e that is coupled to the top plate 63.

In order to form the second wafer 2, the deposition process can be applied to form the second dielectric stack 8 on the first side 60a of the second substrate 60. A patterning process that includes the photolithography process and the etching process can be applied to form a bottom plate opening (not shown). Conductive materials can be subsequently deposited by the deposition process to form the bottom plate 62. A high-K layer 64 can be formed by the deposition process over the bottom plate 62. The patterning process can be applied again to form a top plate opening (not shown) in the second dielectric stack 8, and the deposition process can be applied again to fill the top plate opening with conductive materials to form the top plate 63. Further, the patterning process can be applied to form the contact openings (not shown). Conductive materials can then be deposited in the contact openings to form the second contact structures 68a-68e.

Figure 9:
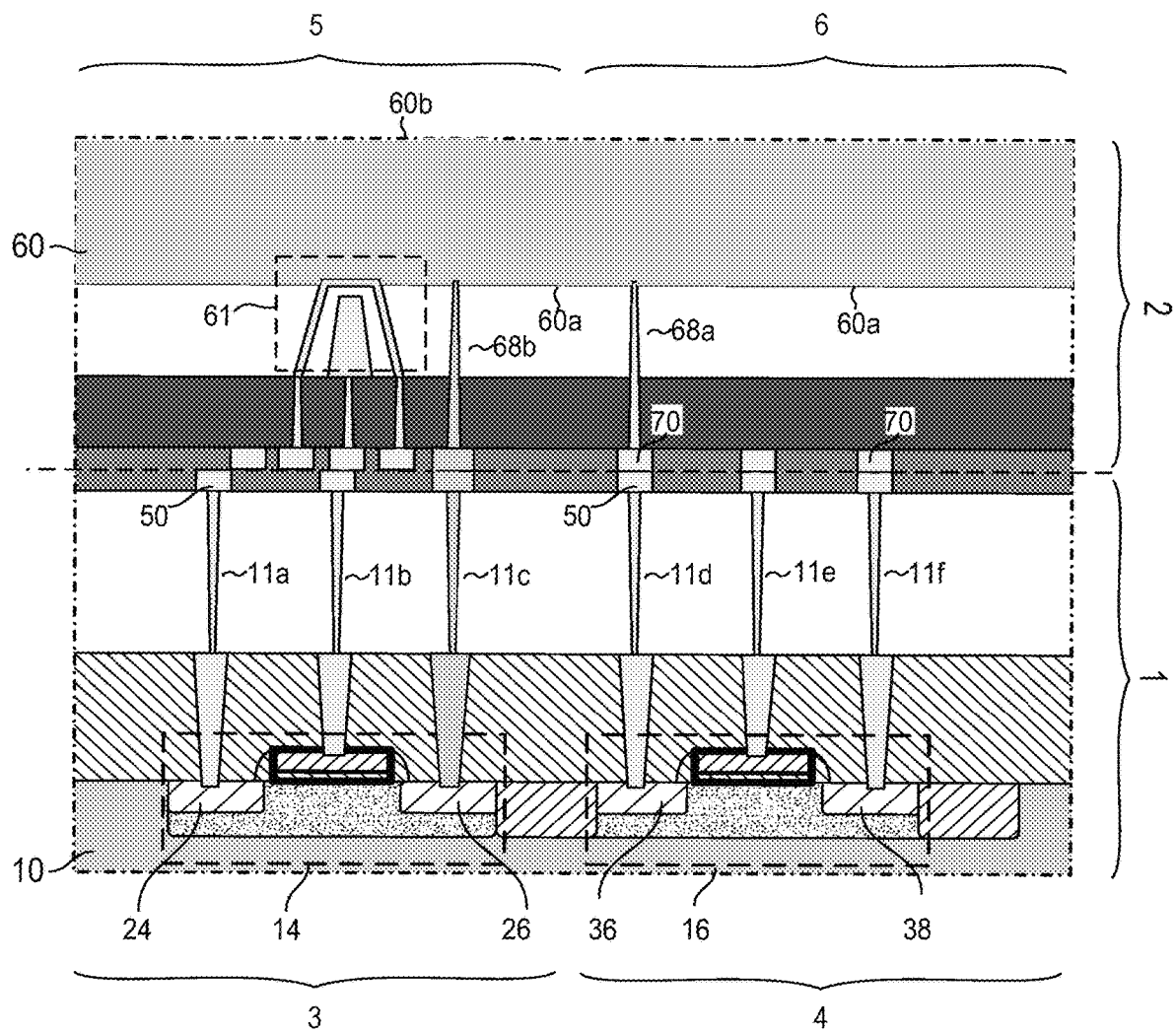

In FIG. 9, a bonding process can be applied to bond the first wafer 1 and the second wafer 2. In order to bond the first wafer 1 to the second wafer 2, a plurality of bonding structures (not shown), such as pillars, can be formed over the M1 layers 50 in the first wafer 1 and/or the M1 layers 70 in the second wafer 2. The bonding structures can include Cu, Ni, and SnAg. Further, the M1 layers 50 can be bonded to the M1 layers 70 through the bonding structures by applying a bonding process. The bonding process can be operated at a temperature more than 220° C. so that the bonding structures can be melt to form a connection between the M1 layers 50 in the first wafer 1 and the M1 layers 70 in the second wafer 2. When the first wafer 1 and the second wafer 2 are bonded together, the first array region 3 in the first wafer 1 can be coupled to the second array region 5 in the second wafer 2. The first periphery region 4 in the first wafer 1 can also be coupled to the second periphery region 6 in the second wafer 2 through the first contact structures and the second contact structures. For example, the second contact structure 68a can be connected to the first contact structure 11d and further be coupled to the first S/D region 36 of the periphery transistor 16. The second contact structure 68b is connected to the first contact structure (or bit line structure) 11c and further be coupled to the second doped region 26 of the array transistor 14.

Figure 10:
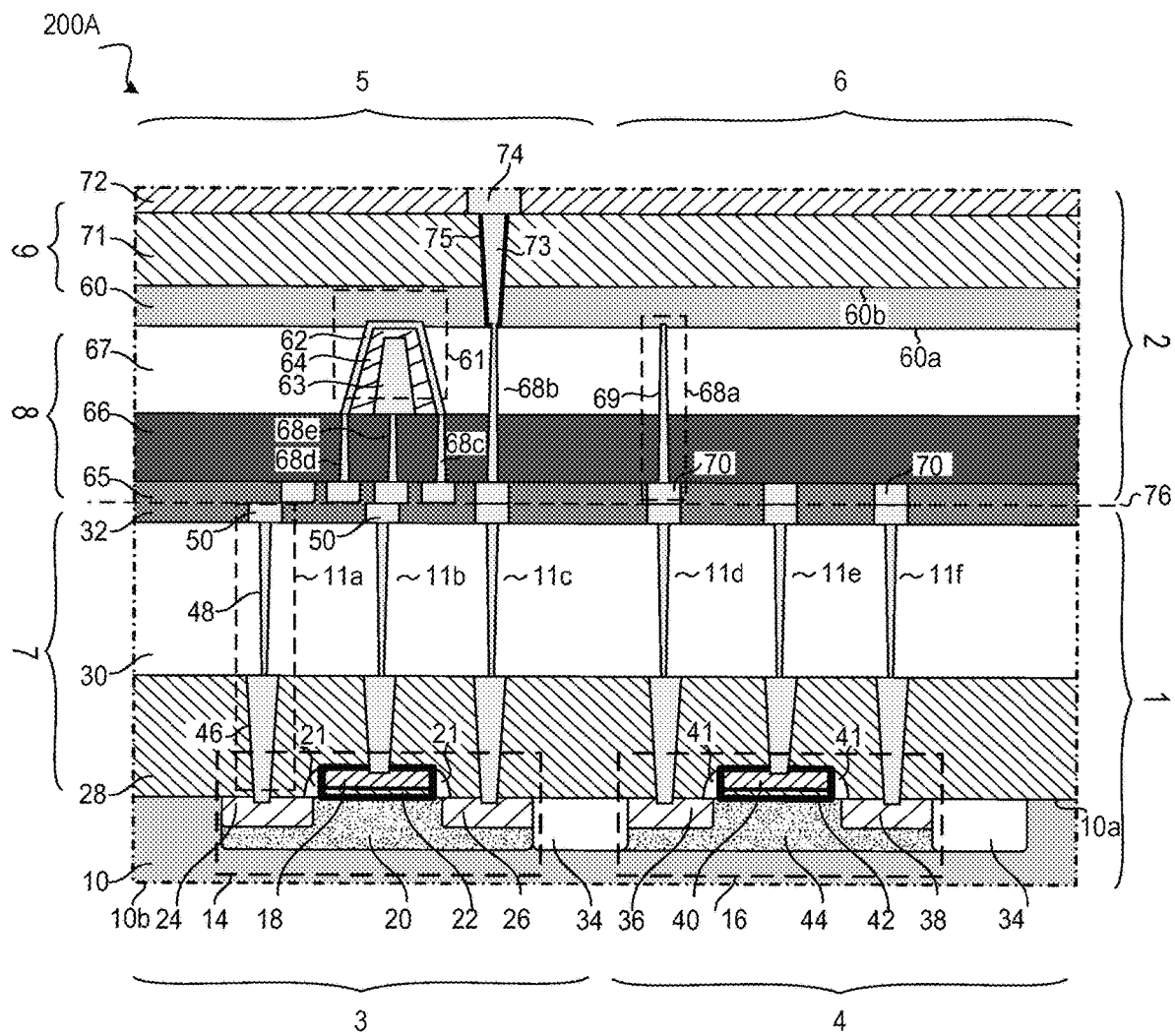

In FIG. 10, a portion of the second substrate 60 can be removed from the second side 60b of the second substrate 60 to reduce a thickness of the second substrate 60. A third dielectric stack 9 can be formed over the second side 60b of the second substrate 60. The third dielectric stack 9 can include one or more ILD layers 71-72. A combination of the photolithography process and the etching process can be applied to form contact openings (not shown) in the third dielectric stack 9. The contact openings can further be extended through the second substrate 60 to expose the second contact structures. For example, the second contact structure 68b can be exposed in FIG. 10. The deposition process, such as a CVD process can be applied to form the barrier layer 75, and an electroplating process, can be applied to form the TSC 73. A PVD process can further be applied to form the BTM 74. When the TSC 73 and the BTM 74 are formed, a DRAM memory device 200A can be formed that has a similar configuration to the DRAM memory device 200A in FIG. 4A.

Figure 11:
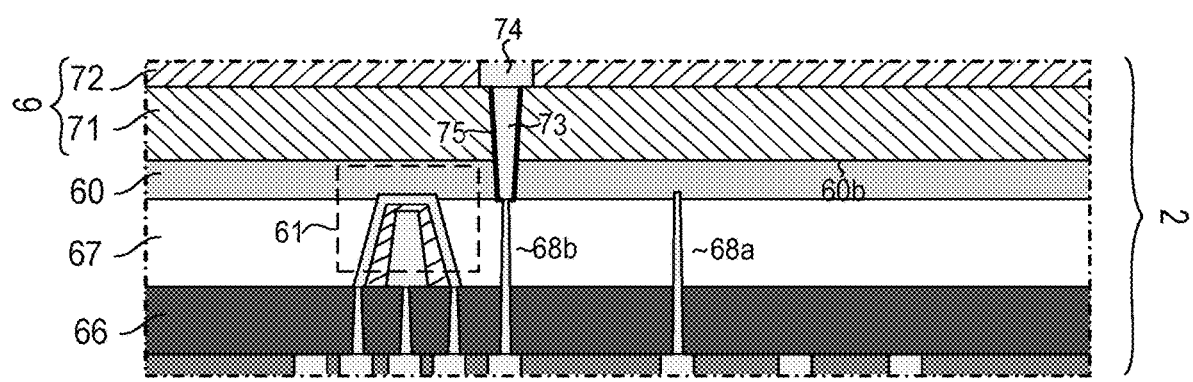

FIGS. 7, 8, 11 and 12 are cross-sectional views of second intermediate steps of manufacturing the first exemplary DRAM memory device 200A, in accordance with exemplary embodiments of the disclosure. As mentioned above, in FIG. 7, the first array region 3 and the first periphery region 4 are formed in the first wafer 1. In FIG. 8, the second array region 5 and the second periphery region 6 are formed in the second wafer 2. The manufacturing process then proceeds to a step illustrated in FIG. 11. In FIG. 11, a portion of the second substrate 60 can be removed from the second side 60b of the second substrate 60 to reduce a thickness of the second substrate 60. A third dielectric stack 9 can be formed over the second side 60b of the second substrate 60. The third dielectric stack 9 can include one or more ILD layers, such as ILD layers 71-72. A combination of the photolithography process and the etching process can be applied to form contact openings (not shown) in the third dielectric stack 9. The contact openings can further be extended through the second substrate 60 to expose the second contact structures. For example, the second contact structure 68b can be exposed in FIG. 11. The deposition process, such as an electroplating process, can be applied to form the TSC 73. A PVD process can further be applied to form the BTM 74.

Figure 12:
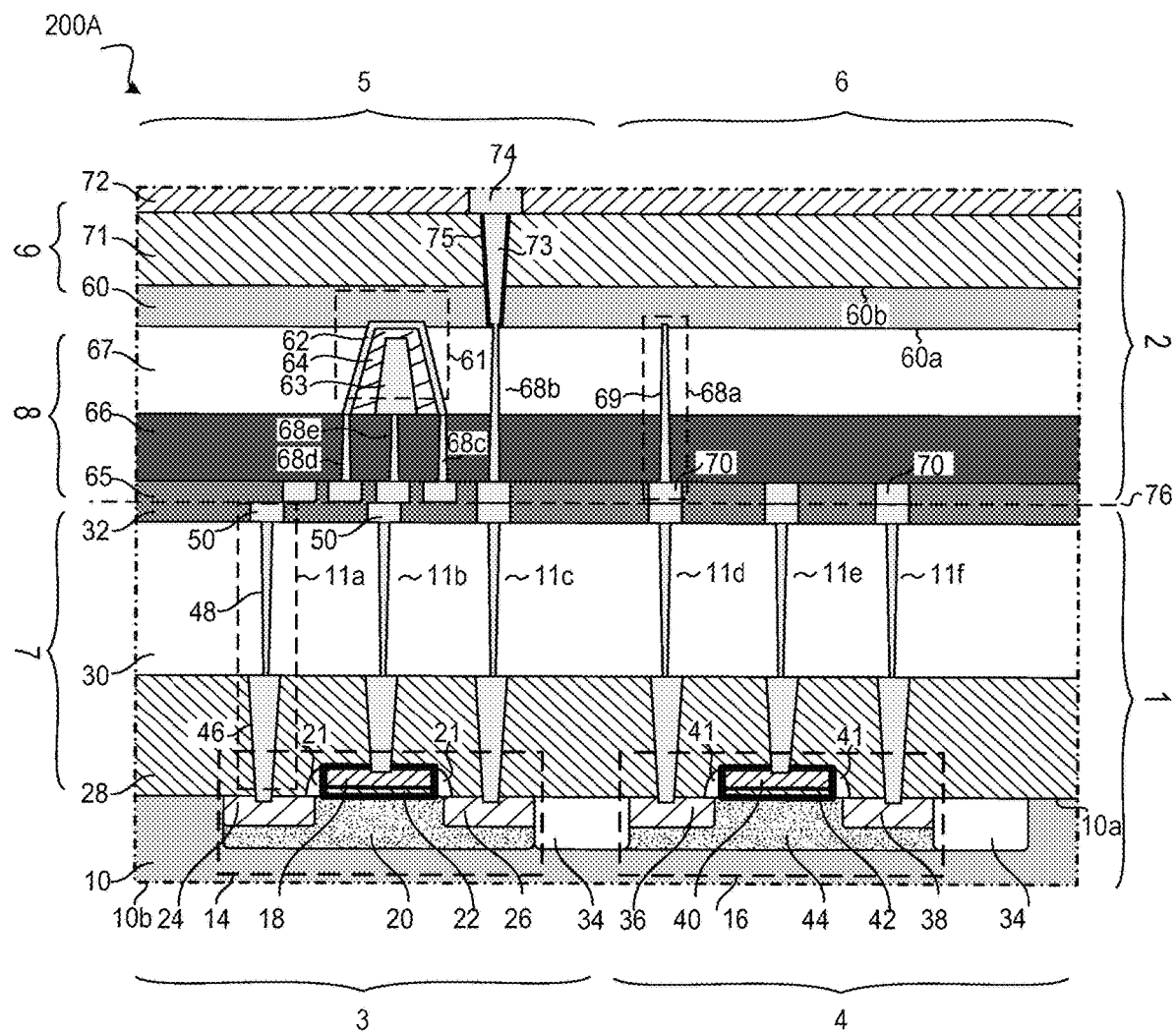

In FIG. 12, the first wafer 1 and the second wafer 2 can be bonded to each other by a bonding process. The bonding process can be similar to the bonding process mentioned in FIG. 9, where a plurality of bonding structures (not shown) can be formed over the M1 layers 50 and/or the M1 layers 70, and the M1 layers 50 and the M1 layers 70 can further be connected to each other by a thermal process to melt the bonding structures. When the bonding process is completed, a bonding interface 76 can be formed between the first wafer 1 and the second wafer 2, and a DRAM memory device 200A can be formed that has a similar configuration to the DRAM memory device 200A illustrated in FIG. 4A.

Figure 13:
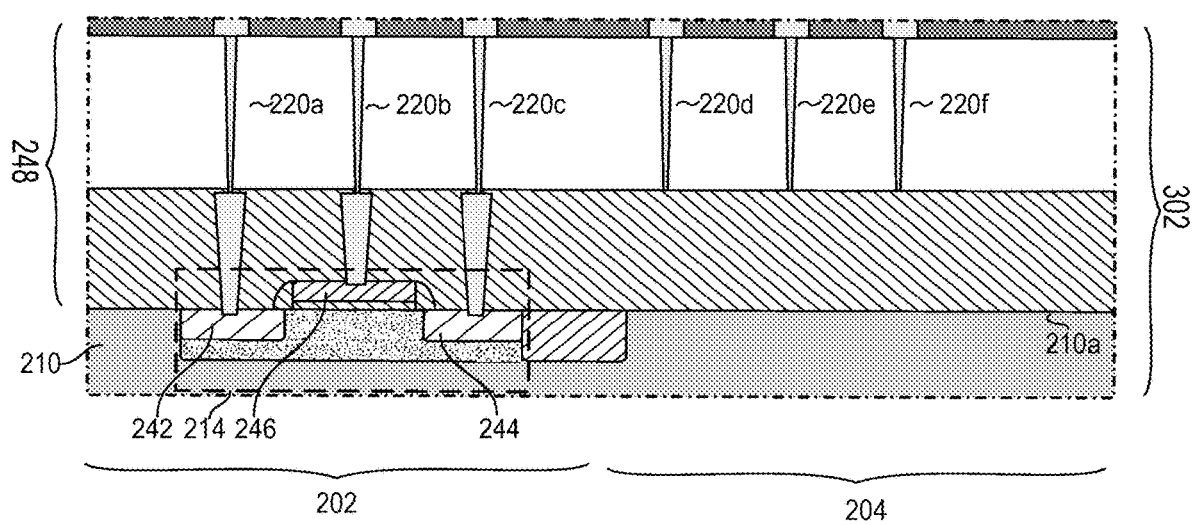
FIGS. 13-15 are cross-sectional views of intermediate steps of manufacturing the second exemplary DRAM memory device, in accordance with exemplary embodiments of the disclosure.
Figure 14:
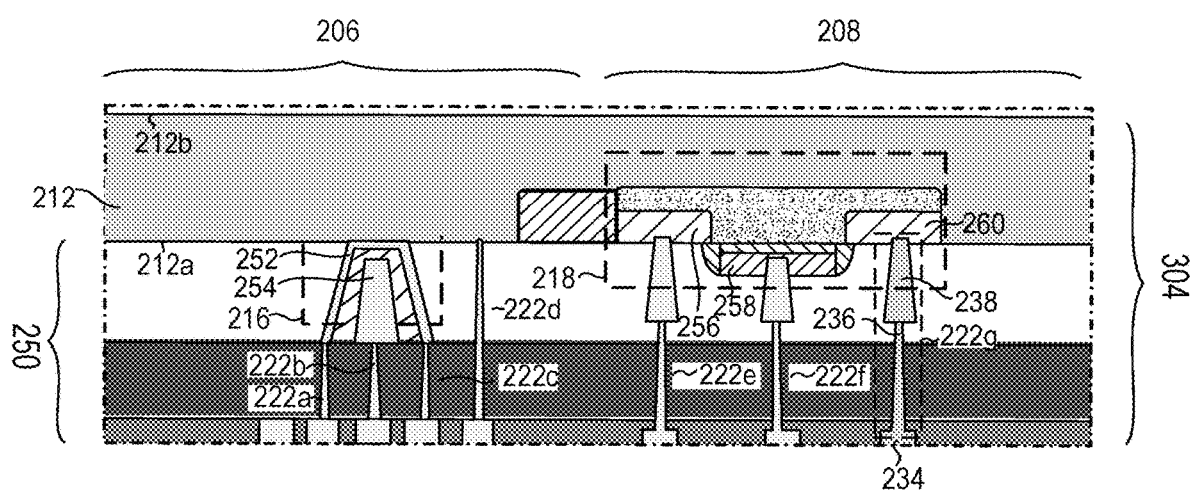
Figure 15:
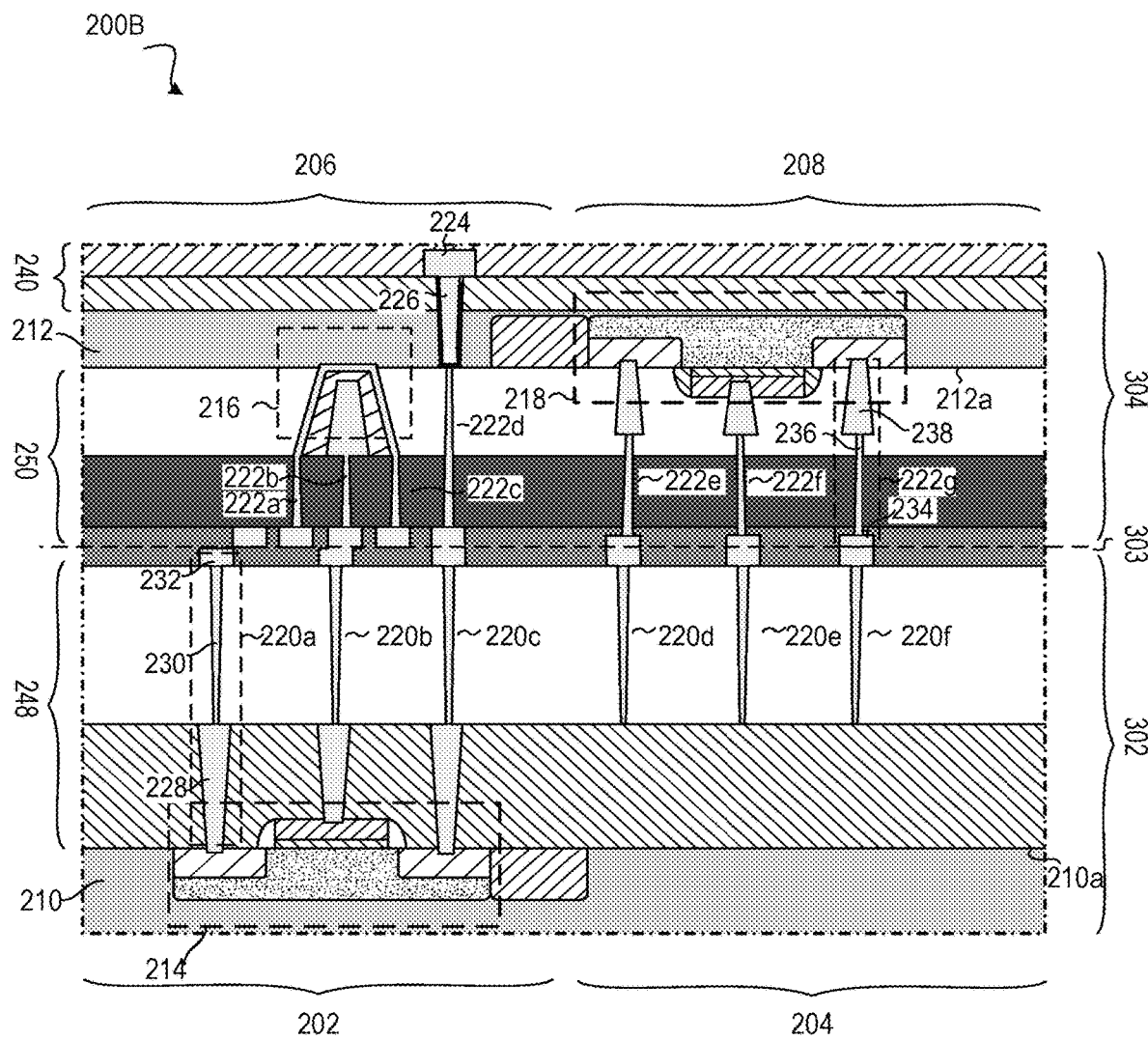

FIGS. 13-15 are cross-sectional views of intermediate steps of manufacturing the second exemplary DRAM memory device 200B, in accordance with exemplary embodiments of the disclosure. As shown in FIG. 13, a first array region 202 and a first periphery region 204 can be formed in a first wafer 302. The first array region 202 can include a plurality of array transistors. For simplicity and clarity, an array transistor 214 is illustrated in the first array region 202. The first wafer 302 can have a first substrate 210 and a first dielectric stack 248 formed on the first side 210a of the first substrate 210. A plurality of first contact structures 220a-220f can be formed in the first dielectric stack 248 and disposed in the first array region 202 and the first periphery region 204. At least one of the first contact structures 220a-220f is coupled to the array transistor 214. For example, the first contact structures 220a-220f can include a first terminal contact 220a that is coupled to a first doped region 242 of the array transistor 214. The first contact structures 220a-220f can also include a word line structure 220b that is coupled to a gate structure 246 of the array transistor 214. The first contact structures 220a-220f can further include a bit line structure 220c that is coupled to a second doped region 244 of the array transistor 214.

In FIG. 14, a second array region 206 and a second periphery region 208 can be formed in a second wafer 304. The second wafer 304 can have a second substrate 212 that has a first side 212a and an opposing second side 212b. A second dielectric stack 250 can be formed on the first side 212a of the second substrate 212. A plurality capacitor structures can be formed in the second array region 206 and positioned in the second dielectric stack 250. A plurality of periphery transistors can be formed in the second periphery region 208 and further extend into the first side 212a of the second substrate 212. For simplicity and clarity, a capacitor structure 216 and a periphery transistor 218 are illustrated in FIG. 14. Further, a plurality of second contact structures 222a-222g can extend away from the first side 212a of the second substrate 212 and be disposed in the second dielectric stack 250.

The second contact structures 222a-222g can be coupled to the capacitor structure 216 and the periphery transistor 218. For example, the second contact structures 222a-222g can include one or more bottom plate contacts 222a and 222c that are coupled to a bottom plate 252 of the capacitor structure 216. The second contact structures 222a-222g can also include a top plate contact 222b that is coupled to a top plate 254 of the capacitor structure 216. The second contact structures 222a-222g can further include a first S/D contact 222e coupled to a first S/D region 256, a gate contact 222f coupled to a gate structure 258, and a second S/D contact 222g coupled to a second S/D region 260 of the periphery transistor 218.

In FIG. 15, the first wafer 302 and the second wafer 304 can be bonded together along a bonding interface 303 so that the first array region 202 and the second array region 206 can be coupled to each other, and the first periphery region 204 and the second periphery region 208 can be coupled to each other. Further, a portion of the second substrate 212 can be removed from the second side 212b of the second substrate 212. A third dielectric stack 240 can be formed on the second side 212b of the second substrate 212. A TSC 226 can be formed in the third dielectric stack 240 and further extend through the second substrate 212 to connect to the second contact structure 222d. A BTM 224 is then formed over the TSC 226. When the TSC 226 and the BTM 224 are completed, a DRAM memory device 200B is formed that has a similar configuration to the device 200B illustrated in FIG. 4B.

Figure 16:
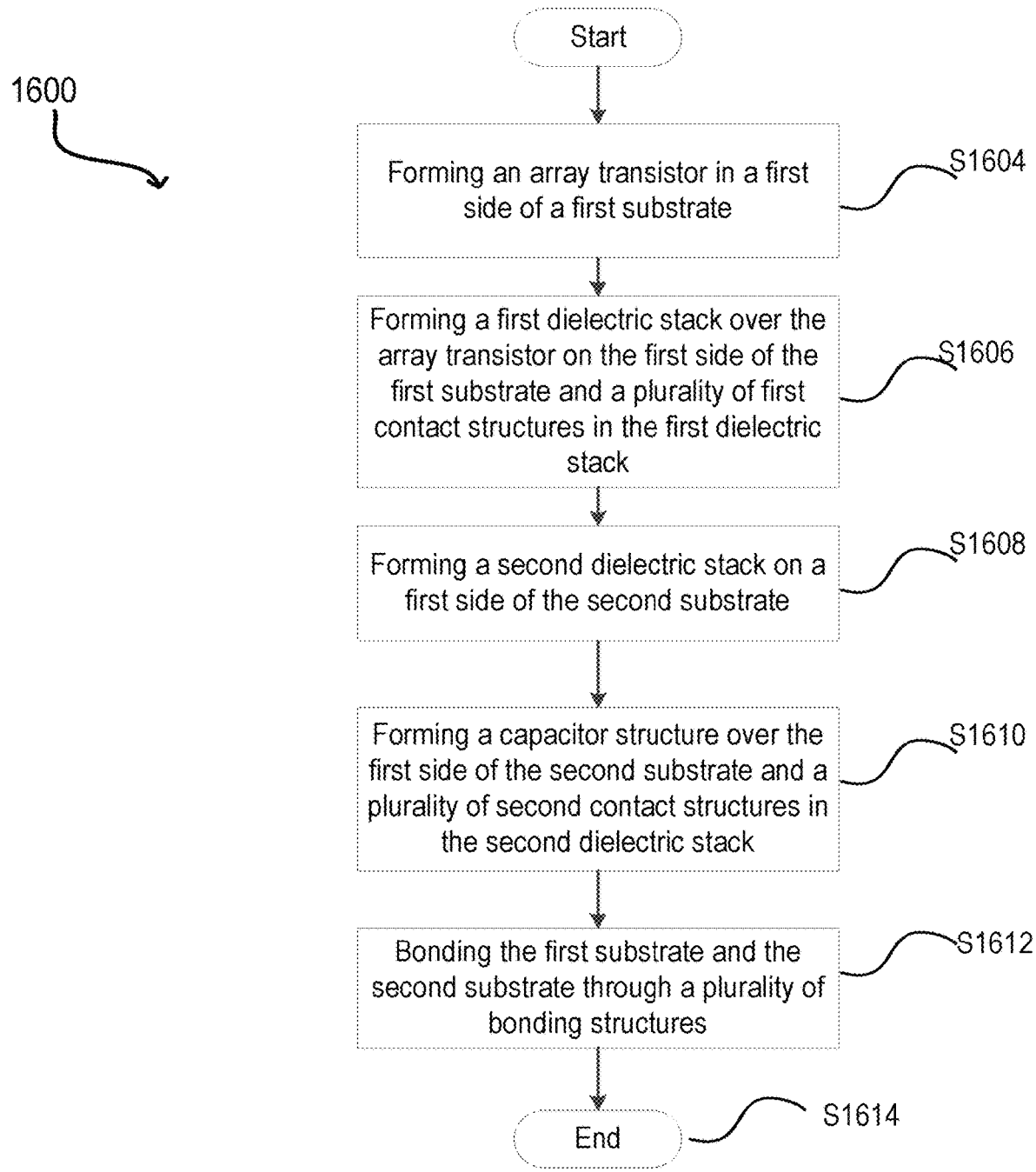
FIG. 16 is a flowchart of a process for manufacturing an exemplary DRAM memory device, in accordance with exemplary embodiments of the disclosure.

FIG. 16 is a flowchart of a process 1600 for manufacturing a DRAM memory device in accordance with some embodiments. The process 1600 begins at step S1604 where an array transistor is formed in a first side of a first substrate. The process 1600 then proceed to step S1604, where a first dielectric stack is formed over the array transistor on the first side of the first substrate and a plurality of first contact structures are formed in the first dielectric stack. The array transistor is coupled to at least one of the first contact structures. In some embodiments, the steps S1604 and S1606 can be performed as illustrated with reference to FIG. 7 or FIG. 13. In FIG. 7, a periphery transistor can also be formed in the first side of the first substrate.

The process 1600 then proceeds to step S1608 where a second dielectric stack can be formed on a first side of the second substrate. At step S1610, a capacitor structure can be formed over the first side of a second substrate, and a plurality of second contact structures can be subsequently formed in the second dielectric stack, where the capacitor structure is coupled to at least one of the second contact structures, and the capacitor structure is positioned in the second dielectric stack. In some embodiments, the steps S1608 and S1610 can be performed as illustrated with reference to FIG. 8 or FIG. 14. In FIG. 14, a periphery transistor can also be formed in the first side of the second substrate.

The process 1600 then proceeds to step S1612, where the first substrate and the second substrate are bonded together through a plurality of bonding structures so that the capacitor structure is coupled to the array transistor, and the first side of the first substrate and the first side of the second substrate face to each other. In some embodiments, the steps S1612 can be performed as illustrated with reference to FIG. 9 or FIG. 15.

It should be noted that additional steps can be provided before, during, and after the process 1600, and some of the steps described herein can be replaced, eliminated, performed in different order, or performed in parallel for additional embodiments of the process 1600. In an example, when the steps S1604 and S1606 are process in the first substrate, the steps S1608 and S1610 can be processed in the second substrate in parallel. In another example, when the first substrate and the second substrate are bonded together, a portion of the second substrate can be removed from the second side of the second substrate. A third dielectric stack can be formed on the second side of the second substrate, and a plurality of TSCs can be formed in the third dielectric stack. The TSCs can further extend through the second substrate to connect to the second contact structures.

In subsequent process steps of the process 1600, various additional interconnect structures (e.g., metallization layers having conductive lines and/or vias) may be formed over the DRAM memory device. Such interconnect structures electrically connect the DRAM memory device with other contact structures and/or active devices to form functional circuits. Additional device features such as passivation layers, input/output structures, and the like may also be formed.

The various embodiments described herein offer several advantages over related DRAM memory devices. For example, in the related DRAM memory devices, memory cells and periphery transistors are processed in a same wafer, which requires a longer process time, and a more complex process flow. The disclosed DRAM memory device is manufactured based on a Xtacking architecture. With the Xtacking architecture, capacitors of the DRAM memory device are processed on an array wafer, and periphery transistors and array transistors of the DRAM memory device are processed on a separate periphery wafer using the logic technology node that enables the desired I/O speed and functions. Once the processing of the array wafer and the processing of the periphery wafer are completed, the two wafers are connected electrically through bonding structures that are formed simultaneously across the whole wafer in one process step. By using the innovative Xtacking technology, a higher storage density, a simpler process flower, and a less cycle time can be achieved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first wafer having a first substrate, an array transistor of a memory cell, and a first dielectric stack formed therein;
    a second wafer having a second substrate, a capacitor structure of the memory cell, a second dielectric stack, and a third dielectric stack formed therein;
    a through silicon contact (TSC) formed in the third dielectric stack; and
    a plurality of bonding structures formed between the first wafer and the second wafer, the plurality of bonding structures are configured to couple the array transistor to the capacitor structure to form the memory cell.

2. The semiconductor device of claim 1, wherein the first substrate includes a first side and an opposing second side, the second substrate includes a first side and an opposing second side, and the array transistor is positioned in the first side of the first substrate.

3. The semiconductor device of claim 2, wherein:
    the first dielectric stack is formed over the array transistor on the first side of the first substrate, a plurality of first contact structures are formed in and extending through the first dielectric stack, and a first terminal contact of the first contact structures is coupled to a first doped region of the array transistor;
    the second dielectric stack is formed on the first side of the second substrate so that the capacitor structure is positioned in the second dielectric stack a plurality of second contact structures are formed in and extending through the second dielectric stack;
    the third dielectric stack is formed on the second side of the second substrate; and
    the TSC is formed in the third dielectric stack and extends from the second side of the second substrate through the second substrate to connect to a second terminal contact of the second contact structures.

4. The semiconductor device of claim 3, wherein the array transistor further comprises:
    a gate structure that is coupled to a word line structure of the first contact structures; and
    a second doped region that is coupled to a bit line structure of the first contact structures.

5. The semiconductor device of claim 4, wherein the capacitor structure further comprises:
    a cup-shaped bottom plate that is formed in the second dielectric stack so as to extend away from the first side of the second substrate and that is coupled to a bottom plate contact of the second contact structures;
    an elongated top plate that is positioned within the bottom plate and that is coupled to a top plate contact of the second contact structures; and
    a high-K layer that is positioned between the bottom plate and the top plate.

6. The semiconductor device of claim 5, wherein the bottom plate contact and the first terminal contact are bonded together, and the bit line structure and the second terminal contact are bonded together.

7. The semiconductor device of claim 6, further comprising:
    a periphery transistor that is formed in the first side of the first substrate.

8. The semiconductor device of claim 7, wherein the periphery transistor further comprises:
    a gate structure that is connected to a gate contact of the first contact structures;
    a source region that is connected to a source contact of the first contact structures; and
    a drain region that is connected to a drain contact of the first contact structures, wherein:
    each of the gate contact, the source contact, and the drain contact is bonded to a respective second contact structure.

9. The semiconductor device of claim 3, further comprising:
    a periphery transistor that is formed in the first side of the second substrate, wherein the periphery transistor comprises:
    a gate structure that is connected to a gate contact of the second contact structures;
    a source region that is connected to a source contact of the second contact structures; and
    a drain region that is connected to a drain contact of the second contact structures, wherein each of the gate contact, the source contact, and the drain contact is bonded to a respective first contact structure.

10. A method for manufacturing a semiconductor device, comprising:
    forming an array transistor of a memory cell in a first side of a first substrate;

forming a first dielectric stack on a first side of a second substrate;

forming a capacitor structure of the memory cell in the first dielectric stack and over the first side of the second substrate;

forming a second dielectric stack over the array transistor on the first side of the first substrate;

removing a portion of the second substrate from a second side that is opposite to the first side of the second substrate;

forming a third dielectric stack over the second side of the second substrate;

forming a through silicon contact (TSC) in the third dielectric stack; and bonding the first substrate and the second substrate through a plurality of bonding structures so that the capacitor structure is coupled to the array transistor to form the memory cell, and the first side of the first substrate and the first side of the second substrate face each other.

11. The method of claim 10, further comprising:
forming a plurality of first contact structures in the second dielectric stack, the array transistor is coupled to at least one of the first contact structures;

forming a plurality of second contact structures in the first dielectric stack, the capacitor structure is coupled to at least one of the second contact structures; and extending the TSC from the second side of the second substrate through the second substrate to connect to a second terminal contact of the second contact structures.

12. The method of claim 11, further comprising:
forming a periphery transistor in the first side of the first substrate, wherein the periphery transistor comprises:
   a gate structure that is connected to a gate contact of the first contact structures;
   a source region that is connected to a source contact of the first contact structures; and
   a drain region that is connected to a drain contact of the first contact structures,
each of the gate contact, the source contact, and the drain contact being bonded to a respective second contact structure.

13. The method of claim 12, wherein forming the array transistor further comprises:
forming a gate structure that is coupled to a word line structure of the first contact structures;
forming a first doped region that is coupled to a first terminal contact of the first contact structures; and
forming a second doped region that is coupled to a bit line structure of the first contact structures.

14. The method of claim 13, wherein forming the capacitor structure further comprises:
forming a cup-shaped bottom plate that is arranged in the first dielectric stack so as to extend away from the first side of the second substrate and that is coupled to a bottom plate contact of the second contact structures;
forming an elongated top plate that is positioned within the bottom plate and coupled to a top plate contact of the second contact structures; and
forming a high-K layer that is positioned between the bottom plate and the top plate.

15. The method of claim 14, wherein bonding the first substrate and the second substrate further comprises:

bonding the bottom plate contact and the first terminal contact together so that the capacitor structure is coupled to the first doped region of the array transistor; and bonding the bit line structure and the second terminal contact together so that the TSC is couple to the second doped region of the array transistor.

16. The method of claim 11, further comprising:
forming a periphery transistor in the first side of the second substrate, wherein the periphery transistor comprises:
   a gate structure that is connected to a gate contact of the second contact structures;
   a source region that is connected to a source contact of the second contact structures; and
   a drain region that is connected to a drain contact of the second contact structures, each of the gate contact, the source contact, and the drain contact being bonded to a respective first contact structure.

17. A semiconductor device, comprises:
a first array region and a first periphery region formed over a first side of a first substrate, the first array region having an array transistor of a memory cell formed in the first side of the first substrate, the first periphery region having at least one periphery transistor formed in the first side of the first substrate;

a second array region and a second periphery region formed over a first side of a second substrate, the second array region having a capacitor structure of the memory cell formed over the first side of the second substrate;

at least one through silicon contact (TSC) formed in a second side of the second substrate that is opposite to the first side of the second substrate and extending from the second side of the second substrate through the second substrate; and a plurality of bonding structures that are configured to bond the first substrate to the second substrate so that the first array region is coupled to the second array region, the array transistor is coupled to the capacitor structure to form the memory cell, and the first periphery region is coupled to the second periphery region.

18. The semiconductor device of claim 17, further comprising:
a first dielectric stack formed over the array transistor of the memory cell on the first side of the first substrate;

a plurality first contact structures formed in and extending through the first dielectric stack, a first terminal contact of the first contact structures being coupled to a first doped region of the array transistor of the memory cell;

a second dielectric stack formed on the first side of the second substrate so that the capacitor structure of the memory cell is positioned in the second dielectric stack;

a plurality of second contact structures formed in and extending through the second dielectric stack; and a third dielectric stack formed on the second side of the second substrate and the at least one TSC is positioned in the third dielectric stack.

19. The semiconductor device of claim 18, wherein the array transistor of the memory cell further comprises:
a gate structure that is coupled to a word line structure of the first contact structures; and
a second doped region that is coupled to a bit line structure of the first contact structures.

20. The semiconductor device of claim 19, wherein the capacitor structure of the memory cell further comprises:

a cup-shaped bottom plate that is formed in the second dielectric stack so as to extend away from the first side of the second substrate and that is coupled to a bottom plate contact of the second contact structures;

an elongated top plate that is positioned within the bottom plate and that is coupled to a top plate contact of the second contact structures; and a high-K layer that is positioned between the bottom plate and the top plate, wherein:

the bottom plate contact and the first terminal contact are bonded together, and the bit line structure and the second terminal contact are bonded together.

\* \* \* \* \*